United States Patent
Ni et al.

(10) Patent No.: US 7,060,958 B1
(45) Date of Patent: Jun. 13, 2006

(54) COMPACT-SIZE IMAGE-SENSING DEVICE AND IMAGE-SENSING ELEMENT THEREOF

(75) Inventors: Yang Ni, Hsin-Chu (TW); Ming Sheng Wu, Hsin-Chu (TW)

(73) Assignee: Elecvision Inc., Hsin-chu (TW)

( * ) Notice: Subject to any disclaimer, the term of this patent is extended or adjusted under 35 U.S.C. 154(b) by 303 days.

(21) Appl. No.: 10/638,410

(22) Filed: Aug. 12, 2003

(30) Foreign Application Priority Data

Feb. 27, 2003 (TW) .............................. 92104143 A

(51) Int. Cl.
H01L 27/00 (2006.01)
H04N 3/14 (2006.01)

(52) U.S. Cl. ..................................... 250/208.1; 348/302
(58) Field of Classification Search ............ 250/208.1; 348/302, 304, 307–310
See application file for complete search history.

(56) References Cited

U.S. PATENT DOCUMENTS

2001/0025912 A1* 10/2001 Kole ....................... 250/208.1
2003/0133029 A1* 7/2003 Booth ........................ 348/294
2003/0164441 A1* 9/2003 Lyon et al. .............. 250/208.1

* cited by examiner

Primary Examiner—Stephone B. Allen
(74) Attorney, Agent, or Firm—Rosenberg, Klein & Lee

(57) ABSTRACT

The invention provides a compact-size image-sensing device and an image-sensing element thereof. The compact-size image-sensing device is composed of a plurality of image-sensing elements that are connected to one another and is connected to a signal output terminal bus. Each image-sensing element includes: a photosensitizing unit that is used to sense the light source and convert it into an electrical signal for outputting so as to generate an voltage difference; a reset circuit to charge the photosensitizing unit so that the photosensitizing unit can be reset back to its original voltage before photosensitizing; and a readout circuit, which is to store the electrical signal and read the electrical signal out to a signal output terminal bus. In addition, the reset circuit of a former image-sensing element is connected to the readout circuit of a latter image-sensing element so that every two image-sensing elements can perform reading-out and resetting simultaneously and respectively by using the same signal line. Therefore, the invention can achieve minimizing the chip size as well as lowering the production cost.

6 Claims, 3 Drawing Sheets

COMPACT-SIZE IMAGE-SENSING DEVICE AND IMAGE-SENSING ELEMENT THEREOF

BACKGROUND OF THE INVENTION

1. Field of the Invention

The invention relates to a compact-size image-sensing device and, more particularly, to a CMOS (Complementary Metal Oxide Semiconductor) image-sensing device that can be minimized.

2. Description of the Related Art

In accordance with the popularity of image and sound multimedia and continuous introductions of digital image equipments, an image sensor begins to play a more important role in the industry. An image sensor is responsible for converting an optical image signal into an electrical signal and is classified into two categories of Charge Coupled Device (CCD) and Complementary Metal Oxide Semiconductor (CMOS) according to the different types of sensing device. Among them, the CCD image sensor is popularized for its stable quality and is most suitable for high-level digital cameras and digital camcorders. On the other hand, the technique of CMOS image sensor has moved into an application phase in recent years, and since it has the advantages of low power consumption, signal power, low cost and high integrity, it has been widely employed in low-level image products such as a low-level digital camera, computer camera, image telephone, videoconference equipment, mobile phone camera and Personal Digital Assistant (PDA).

A pixel cell is a base unit for converting light into electrical signal in an image sensor. FIG. 1 shows the configuration of a pixel cell in a conventional CMOS image sensor. As shown in FIG. 1, a pixel cell 1 includes a reset signal line 10, three transistors 12, 14 and 16, a photodiode 18, and a readout signal line 20 that is connected to the transistor 16, wherein the readout signal line 20 is also connected to a signal output bus 22, and the transistor 12 is connected to a reference voltage terminal 23. By this arrangement, every time before the exposure, the photodiode 18 is charged through the transistor 12 when the reset signal line 10 activated the photodiode 18 can be reset back to its original reference voltage, while the reference voltage is provided by the reference voltage terminal 23. Next, at the time of exposure, the photodiode 18 will generate an voltage change when it is photosensitized. The signal from the voltage change is transmitted to the transistor 16 for storing by the transistor 14 that has a function of source-follower amplify. After the photosensitizing, the transistor 16 will transmitted the readout signal to output terminal 22 by means of the transistor 16 selected by the readout signal line 20 so that the image data readout can be further transmitted to an image processing circuit to proceed with subsequent image processing. Then, every time at the exposure, the actions of reset, exposure and readout will be repeated accordingly.

However, a reset-signal control line and a readout-signal control line are provided in each pixel cell unit in the foregoing control circuit design of the conventional CMOS image-sensing device; therefore, not only will the circuit control become complicated, but the pixel cell size also will be larger in layout, which in turn will result in the chip size to be larger as well as the optical lens to be larger. Subsequently, the requirements of low cost and product minimization cannot be achieved, and the design cannot be competitive with the smaller pixel cell of the CCD, either.

In viewing the above problem, the invention provides a compact-sized image-sensing device, wherein the reset signal and the readout signal inside the image-sensing element are sharing the same signal line to cope with the above problem.

SUMMARY OF THE INVENTION

The object of the invention is to provide a compact-size image-sensing device, wherein the reset signal and the readout signal inside the image-sensing element are sharing one signal line, and by means of that, the previous pixel cell can be reset simultaneously when a pixel cell data is finished with readout so that the pixel cell size can be lowered effectively on the premise that the photosensitizing will not be affected.

Another object of the invention is to provide a compact-size image-sensing device, wherein the layout design of the image-sensing element is capable of utilizing the space thoroughly so that not only can the lines be saved, but the size of the whole device can be minimized and the processing cost and the configuration cost can be lowered.

To achieve the above objects, the compact-size image-sensing device of the invention is composed of a plurality of image-sensing elements that are connected to one another. Each image-sensing element includes: a photosensitizing unit having an original voltage to sense the light source and convert the sensed energy light into an electrical signal for outputting so that an voltage difference can be generated; a reset circuit to charge the photosensitizing unit so that the photosensitizing unit can be reset back to its original voltage before photosensitizing; and a readout signal line that is connected to the photosensitizing unit and the signal output terminal to store the electrical signal as well as to read the electrical signal out to the signal output terminal. The reset circuit of the first image-sensing element is connected to the readout circuit of the second image-sensing element. On the other hand, the connecting relationships between the subsequent image-sensing elements that are after the third image-sensing element will be the same as that of between the first and the second image-sensing element so that when the readout circuit of the latter image-sensing element is performing reading-out, the reset circuit of the former image-sensing element will be performing resetting at the same time; therefore, every two image-sensing elements will perform reading-out and resetting simultaneously and respectively.

The objects and technical contents of the invention will be better understood through the description of the following embodiment with reference to the drawings.

DESCRIPTION OF THE PREFERRED EMBODIMENTS

Figure 1:
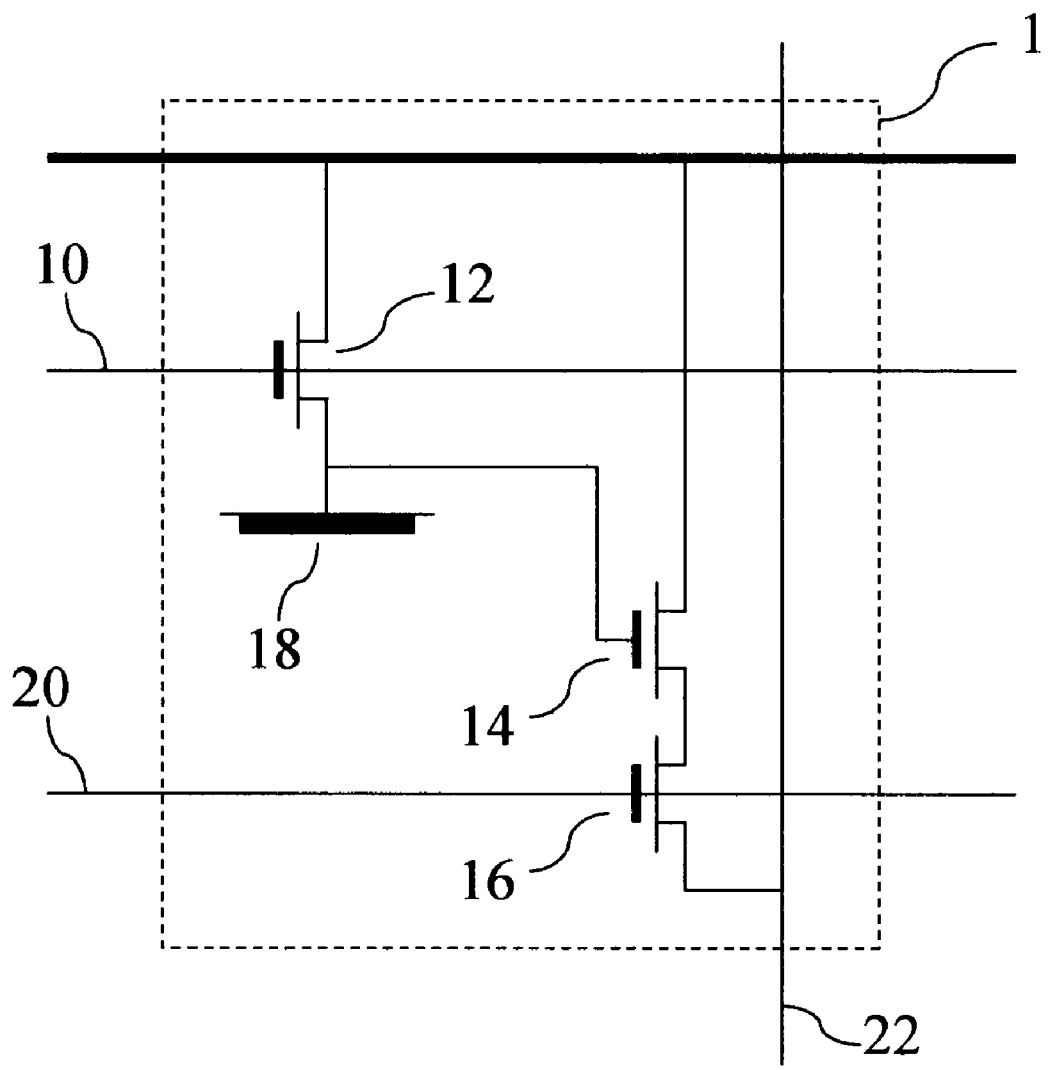
FIG. 1 is a schematic diagram showing the circuit configuration of a pixel cell of a conventional image-sensing device.
Figure 2:
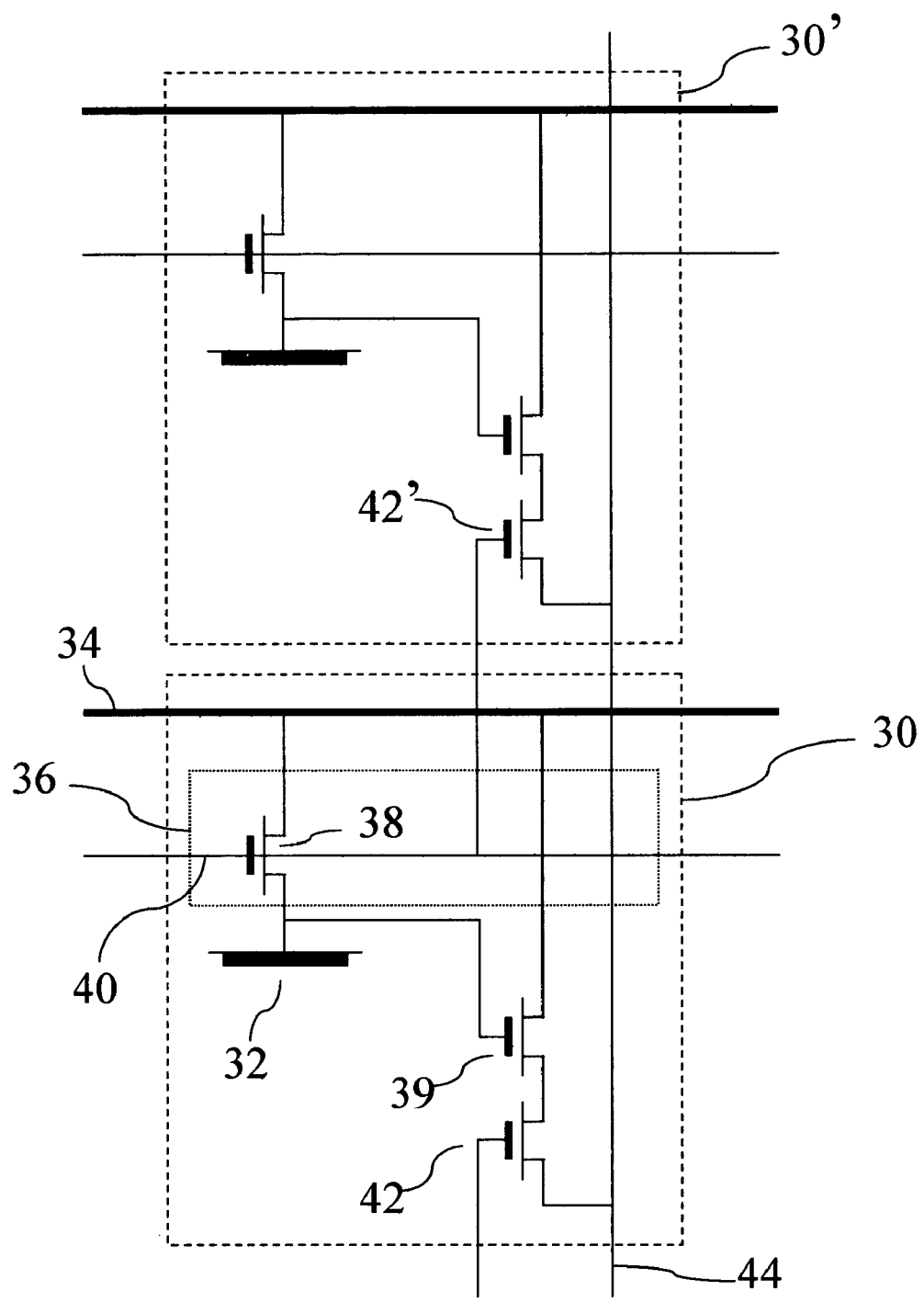
FIG. 2 is a schematic diagram showing the circuit-connecting configuration of two image-sensing elements in a compact-size image-sensing device of the invention.

The compact-size image-sensing device of the invention is composed of a plurality of image-sensing elements that are connected to one another, and the image-sensing device is also connected to a signal output terminal. FIG. 2 is a schematic diagram showing the circuit-connecting configuration of two image-sensing elements in the image-sensing device. Herein, an image-sensing element is a pixel cell. As shown in FIG. 2, the first image-sensing element 30 includes a photosensitizing unit 32, which is often a photodiode having an original voltage for sensing the light source, converting the sensed light energy into a electrical signal for outputting and generating an voltage difference. The photosensitizing unit 32 is connected to a reset circuit 36, which is composed of a transistor 38 and a reset signal line 40, whereas the reset circuit 36 is connected to a reference voltage terminal 34 so that the photosensitizing unit 32 can be charged by the transistor 38 of the reset circuit 36 before exposure in order to reset the photosensitizing unit 32 back to its original voltage before photosensitizing. Besides, the reset circuit 36 will reset the voltage level of the photosensitizing unit 32 back to its original voltage level, whereas the reference voltage terminal 34 will provide the voltage reference. Also, the photosensitizing unit 32 is connected to a transistor 39, which is used to amplify the electrical signal outputted by the photosensitizing unit 32, convert the signal into a voltage signal, and then transmit it into a readout circuit 42. The readout circuit 42 is connected to a signal output terminal bus 44 and also is a transistor for storing the voltage signal inputted by the transistor 40 and for reading the voltage signal out to the signal output terminal bus 44 so that the image signal can be further transmitted from the signal output terminal bus 44 to the subsequent image processing circuit.

The configuration of the internal of the second image-sensing element 30' is the same as that of the first image-sensing element 30. The connecting relationship between the two sensing elements 30 & 30' is that the reset circuit 36 of the first image-sensing element 30 is connected to the readout circuit 42' of the second image-sensing element 30', which means that the reset signal line 40 of the first image-sensing element 30 is connected to the transistor readout circuit 42' of the second image-sensing element 30'. Therefore, the reset signal of the first image-sensing element 30 is sharing the same signal line with the readout signal of the second image-sensing element 30', whereas the connecting relationships between the subsequent image-sensing elements that are after the third image-sensing element (not shown) will be the same as that of between the first and the second image-sensing elements 30 & 30'.

Through the foregoing circuit design, when the image-sensing device of the invention is in operation, the readout circuit 42' of the second image-sensing element 30' is performing reading the voltage signal out to the signal output terminal bus 44, and the reset circuit 36 of the first image-sensing element 30 is performing resetting photosensitizing unit 32 through the reset signal line 40 at the same time; then, every two image-sensing elements will perform reading-out and resetting through the same signal line simultaneously and respectively. Therefore, through the design that every two image-sensing elements are sharing the same signal line to perform reading-out and resetting, it is possible to utilize the same signal line to both read out the image data from an image-sensing element and to reset the previous image-sensing element simultaneously.

Figure 3:
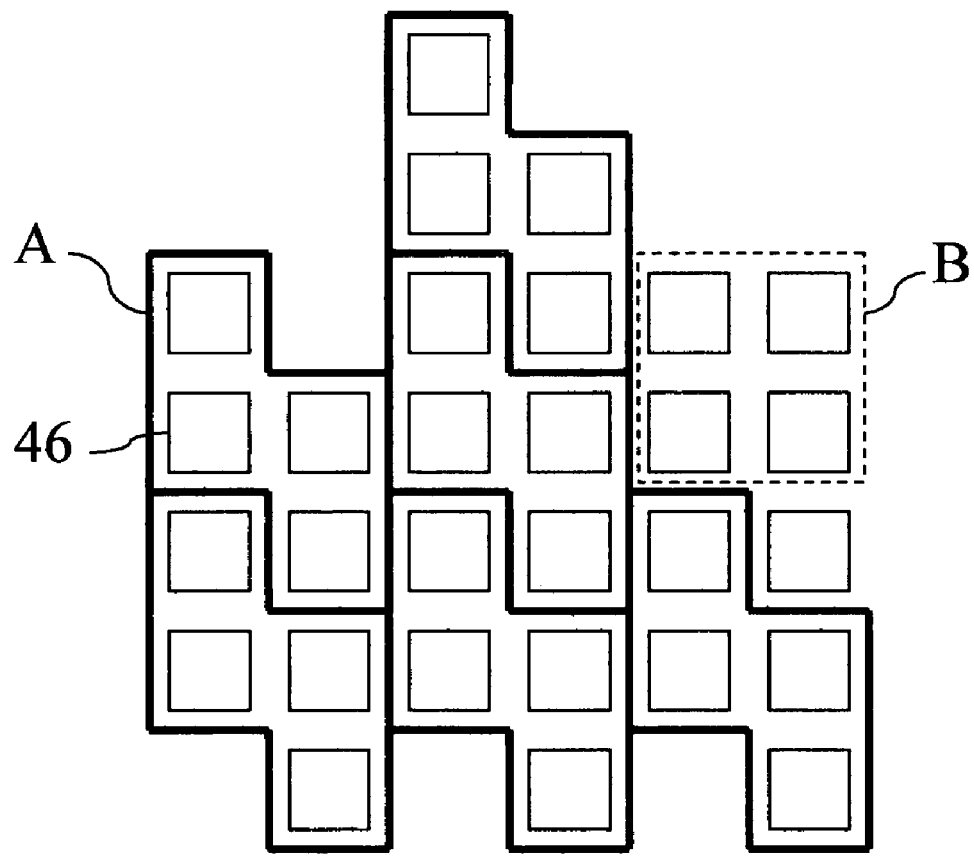
FIG. 3 is a schematic diagram showing the layout of an image-sensing element of the invention.

In addition, since every image-sensing element can be reduced by one signal line, the space wasted by the signal line layout can also be reduced when the pixel cell inside the image-sensing device is doing the signal line layout. Therefore, the single pixel cell can have a smaller size. Moreover, as shown in FIG. 3, the circuit layout can be designed as the pixel 46 that is enclosed by the bold line A as one unit. Unlike the circuit layout of the invention, the circuit layout of the conventional image-sensing device is confined because the pixel contains numerous control lines; therefore, its layout can only be designed as what is enclosed by the dotted line B. Hence, the invention can improve the shortcoming of the conventional layout that is incapable of utilizing the space effectively. In conclusion, on the premise that the photosensitizing is not affected, not only can the invention save the lines, but the size of the pixel cell can also be reduced. Therefore, the size of the whole image-sensing device can be minimized, and the processing cost and the configuration cost can be lowered as well.

The embodiment above is only intended to illustrate the invention; it does not, however, to limit the invention to the specific embodiment. Accordingly, various modifications and changes may be made without departing from the spirit and scope of the invention as described in the appended claims.

What is claimed is:

1. A compact-size image-sensing device, which is composed of a plurality of image-sensing elements that are connected to one another and is connected to a signal output terminal bus, wherein each image-sensing element includes:

a photosensitizing unit, which has an original voltage to sense light energy and convert the sensed light energy into an electrical signal for outputting so that a voltage difference can be generated;

a reset circuit, which is used to charge the photosensitizing unit so that the photosensitizing unit can be reset back to its original voltage level before photosensitizing; and a readout circuit, which is connected to the photosensitizing unit and the signal output terminal bus to store the electrical signal as well as to read out the electrical signal to the signal output terminal bus;

in the above-mentioned configuration, the reset circuit of a first image-sensing element is connected to the readout circuit of a second image-sensing element, whereas the connecting relationships between subsequent image-sensing elements that are after a third image-sensing element will be the same as that of between the first and the second image-sensing element so that when the readout circuit of the latter image-sensing element is performing reading-out, the reset circuit of the former image-sensing element will be performing resetting at the same time; therefore, every two image-sensing elements will perform reading-out and resetting simultaneously and respectively.

2. The compact-size image-sensing device as claimed in claim 1, wherein the photosensitizing unit is a photodiode.

3. The compact-size image-sensing device as claimed in claim 1, wherein the reset circuit is composed of a transistor and a reset signal line.

4. The compact-size image-sensing device as claimed in claim 1, wherein the readout circuit is a first transistor for storing the electrical signal.

5. The compact-size image-sensing device as claimed in claim 4, further including a second transistor that is connected between the first transistor and the photosensitizing unit to amplify the electrical signal outputted by the photosensitizing unit and then to transmit the electrical signal to the first transistor.

6. The compact-size image-sensing device as claimed in claim 1, wherein the reset circuit is further connected to a reference voltage terminal so as to provide a voltage reference to the reset circuit when the reset circuit is resetting the photosensitizing unit.

* * * * *